(12) United States Patent
Ahn et al.

(10) Patent No.: US 6,815,303 B2
(45) Date of Patent: Nov. 9, 2004

(54) BIPOLAR TRANSISTORS WITH LOW-RESISTANCE EMITTER CONTACTS

(75) Inventors: Kie Y. Ahn, Chappaqua, NY (US); Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 149 days.

(21) Appl. No.: 09/069,668

(22) Filed: Apr. 29, 1998

(65) Prior Publication Data

US 2001/0003667 A1 Jun. 14, 2001

(51) Int. Cl.$^7$ ............................................. H01L 21/331
(52) U.S. Cl. ....................................... 438/343; 438/352
(58) Field of Search .................................. 438/343, 352

(56) References Cited

U.S. PATENT DOCUMENTS

| | | | |
|---|---|---|---|
| 3,571,674 A | * 3/1971 | Yu et al. ....................... | 257/474 |
| 3,932,226 A | 1/1976 | Klatskin et al. ............... | 204/16 |
| 4,157,269 A | 6/1979 | Ning et al. ................... | 148/1.5 |
| 4,169,000 A | 9/1979 | Riseman ....................... | 148/187 |
| 4,234,357 A | 11/1980 | Scheppele .................... | 148/1.5 |
| 4,252,582 A | 2/1981 | Anantha et al. ............ | 148/175 |
| 4,442,449 A | 4/1984 | Lehrer et al. ................. | 357/67 |
| 4,470,852 A | 9/1984 | Ellsworth .................... | 148/1.5 |
| 4,483,726 A | 11/1984 | Isaac et al. .................. | 148/187 |
| 4,507,847 A | 4/1985 | Sullivan ....................... | 29/576 |
| 4,651,409 A | 3/1987 | Ellsworth et al. ......... | 29/576 B |
| 4,670,297 A | 6/1987 | Lee et al. ...................... | 427/91 |
| 4,702,941 A | 10/1987 | Mitchell et al. ............. | 427/250 |
| 4,800,177 A | 1/1989 | Nakamae ..................... | 437/193 |
| 4,855,252 A | 8/1989 | Peterman .................... | 437/189 |
| 4,857,481 A | 8/1989 | Tam et al. ................... | 437/182 |
| 4,959,705 A | 9/1990 | Lemnios ..................... | 257/522 |
| 4,987,562 A | * 1/1991 | Watanabe .................... | 257/742 |
| 5,010,039 A | 4/1991 | Ku et al. ..................... | 437/228 |

(List continued on next page.)

FOREIGN PATENT DOCUMENTS

JP    5-62925 A   * 3/1993 ........... H01L/21/28

OTHER PUBLICATIONS

Hori et al., Novel High Aspect Ratio Aluminum Plug for Logic/DRAM LSIs Using Polysilicon–Aluminum Substitute (PAS), IEEE, IDEM Dec. 1996, pp 14.7.1–14.7.3.*

Merriam–Webster's Collegiate Dictionary, 10$^{th}$ edition, 1998, pp. 610.*

IBM Technical Disclosure Bulletin, "Method to Reduce Mechanical Stress Within the Emitter of Bipolar Transistors", vol. 28, issue #4, pp. 1442, Sep. 1, 1985.*

Wolf, "Silicon Processing For The VLSI Era", vol. 2: Process Integration, Lattice Press, 1990.*

(List continued on next page.)

*Primary Examiner*—W. David Coleman
(74) *Attorney, Agent, or Firm*—Schwegman, Lundberg, Woessner & Kluth, P.A.

(57) ABSTRACT

Many integrated circuits include a type of transistor known as a bipolar junction transistor, which has an emitter contact formed of polysilicon. Unfortunately, polysilicon has a relatively high electrical resistance that poses an obstacle to improving switching speed and current gain of bipolar transistors. Current fabrication techniques involve high temperature procedures that melt desirable low-resistance substitutes, such as aluminum, during fabrication. Accordingly, one embodiment of the invention provides an emitter contact structure that includes a polysilicon-carbide layer and a low-resistance aluminum, gold, or silver member to reduce emitter resistance. Moreover, to overcome manufacturing difficulties, the inventors employ a metal-substitution technique, which entails formation of a polysilicon emitter, and then substitution of metal for the polysilicon.

35 Claims, 3 Drawing Sheets

U.S. PATENT DOCUMENTS

| | | | |
|---|---|---|---|
| 5,040,049 A | 8/1991 | Raaijmakers | 357/71 |
| 5,051,805 A | 9/1991 | Custode | 357/34 |
| 5,118,634 A * | 6/1992 | Neudeck et al. | 438/341 |
| 5,148,260 A | 9/1992 | Inoue et al. | 357/67 |
| 5,158,986 A | 10/1992 | Cha et al. | 521/82 |
| 5,187,560 A | 2/1993 | Yoshida et al. | 257/743 |
| 5,235,204 A * | 8/1993 | Tsai | 257/408 |
| 5,241,193 A | 8/1993 | Pfiester et al. | 257/67 |
| 5,268,315 A | 12/1993 | Prasad et al. | 437/31 |
| 5,280,188 A | 1/1994 | Iwasaki | 257/370 |
| 5,308,440 A | 5/1994 | Chino et al. | 156/664 |
| 5,324,684 A | 6/1994 | Kermani et al. | 437/95 |
| 5,334,356 A | 8/1994 | Baldwin et al. | 422/133 |
| 5,341,016 A | 8/1994 | Prall et al. | 257/412 |
| 5,355,020 A * | 10/1994 | Lee et al. | 257/741 |
| 5,371,035 A | 12/1994 | Pfiester et al. | 437/69 |
| 5,391,911 A | 2/1995 | Beyer et al. | 257/522 |
| 5,436,496 A | 7/1995 | Jerome et al. | 257/529 |
| 5,442,226 A | 8/1995 | Maeda et al. | 257/557 |
| 5,454,928 A | 10/1995 | Rogers et al. | 205/125 |
| 5,458,702 A | 10/1995 | Ono et al. | 148/432 |
| 5,470,801 A | 11/1995 | Kapoor et al. | 437/238 |
| 5,501,645 A | 3/1996 | Taniguchi et al. | 477/130 |
| 5,510,645 A | 4/1996 | Fitch et al. | 257/522 |
| 5,512,785 A * | 4/1996 | Haver et al. | 357/758 |
| 5,516,724 A | 5/1996 | Ast et al. | 437/160 |
| 5,516,745 A | 5/1996 | Friesen et al. | 502/401 |
| 5,539,227 A | 7/1996 | Nakano | 257/276 |
| 5,541,124 A | 7/1996 | Miwa et al. | 437/31 |
| 5,563,448 A | 10/1996 | Lee et al. | 257/742 |
| 5,587,326 A * | 12/1996 | Takemura | 438/365 |
| 5,593,921 A | 1/1997 | Chen et al. | 437/195 |
| 5,639,979 A | 6/1997 | Chen et al. | 84/615 |
| 5,643,806 A | 7/1997 | Miwa et al. | 437/31 |
| 5,648,280 A | 7/1997 | Kato | 437/31 |
| 5,698,890 A | 12/1997 | Sato | 257/592 |
| 5,705,425 A | 1/1998 | Miura et al. | 437/182 |
| 5,710,454 A | 1/1998 | Wu | 257/413 |
| 5,723,378 A | 3/1998 | Sato | 438/309 |
| 5,731,240 A | 3/1998 | Kataoka | 438/364 |
| 5,745,990 A * | 5/1998 | Lee et al. | 29/852 |
| 5,753,967 A | 5/1998 | Lin | 257/635 |
| 5,757,072 A | 5/1998 | Gorowitz et al. | 257/700 |
| 5,766,999 A * | 6/1998 | Sato | 438/309 |
| 5,796,151 A | 8/1998 | Hsu et al. | 257/410 |
| 5,796,166 A | 8/1998 | Agnello et al. | 257/751 |
| 5,798,544 A | 8/1998 | Ohya et al. | 257/296 |
| 5,798,559 A | 8/1998 | Bothra et al. | 257/522 |
| 5,801,444 A * | 9/1998 | Aboelfotoh et al. | 257/762 |
| 5,847,439 A | 12/1998 | Reinberg | 257/522 |
| 5,861,340 A | 1/1999 | Bai et al. | 438/592 |
| 5,891,797 A | 4/1999 | Farrar | 438/619 |
| 5,920,121 A | 7/1999 | Forbes et al. | 257/742 |
| 5,925,918 A | 7/1999 | Wu et al. | 257/413 |
| 5,925,933 A | 7/1999 | Colgan et al. | 257/762 |
| 5,930,596 A | 7/1999 | Klose et al. | 438/98 |
| 5,930,668 A | 7/1999 | Gardner | 438/624 |
| 5,942,799 A | 8/1999 | Danek et al. | 257/751 |
| 5,960,313 A | 9/1999 | Jun | 438/624 |
| 5,989,718 A | 11/1999 | Smith et al. | 428/446 |
| 6,025,261 A | 2/2000 | Farrar et al. | 438/619 |
| 6,069,389 A * | 5/2000 | Sasaki | 257/370 |
| 6,080,646 A | 6/2000 | Wang | 438/585 |
| 6,150,252 A | 11/2000 | Hsu et al. | 438/637 |
| 6,157,082 A | 12/2000 | Merchant et al. | 257/758 |
| 6,180,509 B1 | 1/2001 | Huang et al. | 438/624 |
| 6,211,562 B1 | 4/2001 | Forbes et al. | 257/581 |
| 6,245,663 B1 | 6/2001 | Zhao et al. | |
| 6,265,602 B1 | 7/2001 | Voit et al. | 558/459 |
| 6,271,551 B1 | 8/2001 | Schmitz et al. | 257/288 |

OTHER PUBLICATIONS

Hamakawa, Y., et al., "Optoelectronics and Photovoltaic Applications of Microcrystalline SiC", *Materials Research Society Symposium Proceedings*, 164, Boston, MA, 291–301, (Nov. 29–Dec. 1, 1989).

Mohajerzadeh, S., et al., "A Low Energy Ion Beam Assisted Deposition Technique for Realizaing iso–type SiGe/Si hetero–interface diodes", *Thin Solid Films*, 283, 182–187, (1996).

Mohajerzadeh, S., et al., "A Low–Temperature Ion Vapor Deposition Technique for Silicon and Silicon–Germanium Epitaxy", *Canadian J. Physics*, 74, S69–S73, (1996).

Mohri, M., et al., "Effect of SiF(4)/SiH(4)/H(2) Flow Rates on Film Properties of Low–Temperature Polycrystalline Silicon Films Prepared by Plasma Enhanced Chemical Vapor Deposition", *IEICE Transactions on Electronics*, E77–C, 1677–1684, (Oct. 1994).

Ashburn, P., et al., "Comparison of Experimental and Theoretical Results on Polysilicon Emitter Bipolar Transistors", *IEEE Trans. on Electron Devices*, vol. ED–31, 853–60, (1984).

Berezhnoi, A., *Silicon and its Binary Systems*, Consultants Bureau, New York, 84, (1960).

Chor, E. F., et al., "Emitter Resistance of Arsenic– and Phosphorus–Doped Polysilicon Emitter Transistors", *IEEE Trans. on Electron Devices*, vol. ED–6, No. 10, 516–18 (1985).

Fukuda, Y., et al., "A New Fusible–Type Programmable Element Composed of Aluminum and Polysilicon", *IEEE Trans. on Electron Devices*, ED–33, 250–253, (Feb., 1986).

Hanna, J., et al., "Early Stage of Polycrystalline Growth of Ge and SiGe by Reactive Thermal CVD from GeF(4) and Si(2)H(6)", *Materials Res. Soc. Symp. Proc.*, 358, Boston, MA, 877–881, (Nov./Dec., 1994).

Hansen, P., *Constitution of Binary Alloys*, McGraw–Hill, New York, 103, (1958).

Hiraki, A., et al., "Formation of Silicon Oxide over Gold Layers on Silicon Substrates", *J. Applied Physics*, 43, 3643–3649, (Sep., 1972).

Hiraki, A., et al., "Low–Temperature Migration of Silicon in Metal Films on Silicon Substrates Studiedby Backscattering Techniques", *J. Vacuum Science and Tech.*, 9,155–158, (Jan./Feb., 1972).

Horie, H., et al., "Novel High Aspect Ratio Aluminum Plug for Logic/DRAM LSI's Using Polysilicon–Aluminum Substitute", *Technical Digest: IEEE Int. Electron Devices Meeting*, San Francisco, CA, 946–948, (1996).

Hurley, P., et al., "Low Temperature Plasma Oxidation of Polycrystalline Silicon", *Proc. 7th European Conf. on Insulating Films on Semiconductors: Contributed Papers, Section 5*, IOP Publishing Ltd., 235–238, (1991).

Hwang, J., et al., "Novel Polysilicon/TiN Stacked–Gate Structure for Fully–Depleted SOI/CMOS", *Technical Digest: Int. Electron Devices Meeting*, San Francisco, CA, 345–348, (Dec. 1992).

King, T., et al., "Deposition and Properties of Low–Pressure Chemical–Vapor Deposited Polycrystalline Silicon–Germanium Films", *J. Electrochemical Society*, 141, 2235–2241, (Aug. 1994).

Lee, D.H., et al., "Gate Oxide Integrity (GOI) of MOS transistors with W/TiN stacked gate", *1996 Symposium on VLSI Technology Digest of Technical Papers*, 208–209, (1996).

Li, C., et al., "Low Temperature Heteroepitaxial Growth of Si (1−x)GE (x) −on−Si by Photo−Enhanced Ultra High Vacuum Chemical Vapor Deposition Using Si(2)H(6) and Ge(2)H(6)", *J. Electronic Materials*, 24, 875–884, (Jul. 1995).

Li, P., et al., "Formation of Stoichiometric SiGe Oxide by Electron Cyclotron Resonance Plasma", *Appl. Phys. Lett.* 60, 3265–3267, (Jun. 1992).

Lyman, T.e., "Metallography, Structure and Phase Diagrams", *Metals Handbook, 8*, American Society for Metals; Metals Park, Ohio, 253, 256, 260, 263,, (1989).

Moffatt, W., *The Handbook of Binary Phase Diagrams*, General Electric Company, pub., vol. 1, 3/84, (1978).

Mohajerzadeh, S., et al., "A Low Energy Ion Beam Assisted Deposition Technique for Realizaing iso–type SiGe/Si hetero–interface diodes", *Thin Solid Films*, 283, 182–187, (1996).

Mohri, M., et al., "Effect of SiF(4)/SiH(4)/H(2) Flow Rates on Film Properties of Low–Temperature Polycrystalline Silicon Films Prepared by Plasma Enhanced Chemical Vapor Deposition", *IEICE Transactions on Electronics*, E77–C, 1677–1684, (Oct. 1994).

Moller, H., et al., "In–situ p– and n–Doping of Low Temperature Grown Beta–SiC Epitaxial Layers on Silicon", *Proc. of International Conference on Silicon Carbide and Related Materials*, IOP Publishing, UK, 497–500, (1996).

Mukhopadhyay, M., et al., "Properties of SiGe Oxides Grown in a Microwave Oxygen Plasma", *J. Applied Physics*, 78, 6135–6140, (Nov. 1995).

Predel, B., et al., "Die Zustandsdiagramme Silber–Germanium–Silizium und Gold–Germanium–Silizium", *J. Less−Common Metals*, 44, 39–49, (Jan. 1976).

Schadel, H., et al., "Activity of Liquid Silver–Silicon Alloys", *Trans. American Institute of Mining and Metallurgical Engineers*, 188, 1282–1283, (Oct. 1950).

Shafi, Z.A., et al., "Poly–Crystalline Silicon–Carbide (SiC) Emitter Bipolar Transistors", *IEEE Bipolar Circuits and Technology Meeting*, Minneapolis, MN, 67–70, (1991).

Uchino, T., et al., "Very High Speed Silicon Bipolar Transistors with In–Situ Doped Polysilicon Emitter and Rapid Vapor–Phase Doping Base", *IEEE Trans. on Electron Devices*, vol. 42, No. 1, 406–12, (1995).

Ushiku, Y., et al., "Planarized Silver Interconnect Technology with a Ti Self–Passivation Technique for Deep Sub-–Micron ULSI", *1993 Symp. on VLSI Technology: Digest of Technical Papers*, 121–122, (1993).

Villars, P., et al., *Handbook of Ternary Alloy Phase Diagrams*, vol. 3, ASM International, 2893–99.

Walczyk, F., et al., "Tailoring Interfacial Oxide for Polysilicon Bit–Cell Contacts and Emitters with In Situ Vapor HF Interface Cleaning and Polysilicon Deposition in a 4Mbit BiCMOS Fast Static RAM", *Proc. IEEE Bipolar Circuits and Technology Meeting*, Minneapolis, MN, 84–87, (1992).

Wu, S., et al., "Suppression of the Boron Penetration Induced Si/SiO2 Interface Degradation by Using a Stacked–Amorphous–Silicon Film as the Gate Structure for pMOSFET", *IEEE Electron Device Letters*, 15, 160–162, (May 1994).

Cherkasov, Y A., et al., "Optical information media based on an amorphous photoconductor with high avalanche amplification—the amorphous analog of trigonal selenium", *Journal of Optical Technology*, vol. 64, No. 7, (Jul. 7, 1997), 627–32.

Moffatt, W. G., *The Handbook of Binary Phase Diagrams*, 2, Genium Publishing Corporation,(1984),p. 6/80.

Shuto, Susumu, et al., "Read Disturb Degradation Mechanism for Source Erase Flash Memories", *1996 Symposium on VLSI Technology, Digest of Technical Papers*, Honolulu, HI,(1996),242–43.

Van Zant, Peter, "via–definition", *Microchip Fabrication. A Practical Guide to Semiconductor Processing*, 3rd Edition, McGraw–Hill, New York, NY,(1997), 604.

* cited by examiner

BIPOLAR TRANSISTORS WITH LOW-RESISTANCE EMITTER CONTACTS

BACKGROUND OF THE INVENTION

The present invention concerns integrated circuits, particularly fabrication methods, structures, and circuits for bipolar transistors.

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic transistors, resistors, and other electrical components on a silicon substrate, known as a wafer. The components are then "wired," or interconnected, together to define a specific electric circuit, such as a computer memory, microprocessor, or logic circuit.

Many integrated circuits include a common type of transistor known as a bipolar transistor or bipolar junction transistor. The bipolar transistor has three terminals, or contacts: a base, a collector, and an emitter. In digital integrated circuits, such as memories, microprocessors, and logic circuits which operate with electrical signals representing ones and zeroes, the bipolar transistor behaves primarily as a switch, with the base serving to open and close an electrical connection between its collector and emitter. Closing the switch essentially requires applying a certain current to the base, and opening it requires applying a reverse current.

One class of bipolar transistor problems concerns the structure, composition, and fabrication of its emitter contact. This contact is a highly conductive structure that facilitates electrical connection of the emitter region of the transistor to other parts of a circuit. Conventional emitter contacts are formed from polysilicon using a self-aligned bipolar technology, a simple fabrication technique which accurately aligns the polysilicon base and emitter contacts of bipolar transistors. The self-aligned bipolar technology is widely used not only because of its simplicity, but because it yields bipolar transistors with shallow emitters and bases which in turn provide good switching speed and current gain. Yet, in looking to the future, the polysilicon emitter contacts, which have a higher than desirable electrical resistance, stand in the way of better switching speed and current gain — two criteria important to the development of faster computers and other devices that use integrated circuits.

One promising solution to this problem is to form the emitter contact from a material with less resistance than polysilicon. For example, aluminum has about one-tenth the resistance of polysilicon. However, the 650° C. melting temperature of aluminum is less than some temperatures inherent to the self-aligned bipolar technology. In particular, the conventional self-alignment technique includes outdiffusion and emitter-driving steps that require heating the emitter contact to 900–1000° C., which would undoubtedly melt an aluminum emitter contact.

Accordingly, there is a need not only for bipolar transistors with lower, emitter-contact resistance, but also for methods of making them.

SUMMARY OF THE INVENTION

To address this and other needs, the inventors have developed bipolar transistor with low-resistance, aluminum, silver, and gold emitter contacts, as well as methods for making them. One method embodiment forms a conventional bipolar transistor with a polysilicon emitter contact, and then substitutes at least a portion of the polysilicon emitter contact with either aluminum, silver, or gold, to reduce its resistance and thereby provide superior switching speed and current gain.

In an exemplary embodiment, the substitution of aluminum for the polysilicon emitter contact entails depositing aluminum on the polysilicon contact and then annealing the resulting structure to urge cross-diffusion of the aluminum and the polysilicon. The cross-diffusion ultimately displaces substantially all of the polysilicon with aluminum, leaving behind a low resistance aluminum contact. Another facet of the invention include a heterojunction bipolar transistor with a low-resistance emitter contacts. And, still another is an integrated memory circuit which includes bipolar transistors with the low-resistance emitter contact.

DETAILED DESCRIPTION OF PREFERRED EMBODIMENTS

The following detailed description, which references and incorporates FIGS. 1–7, describes and illustrates specific embodiments of the invention. These embodiments, offered not to limit but only to exemplify and teach the invention, are shown and described in sufficient detail to enable those skilled in the art to practice the invention. Thus, where appropriate to avoid obscuring the invention, the description may omit certain information known to those of skill in the art.

Exemplary Fabrication Method and Structure for Bipolar Transistor with Low-Resistance Emitter Contact FIGS. 1–6 show a number of exemplary integrated-circuit assemblies, which taken collectively and sequentially illustrate the exemplary method of making a bipolar transistor with a low-resistance emitter contact. In particular, FIGS.

Figure 3:
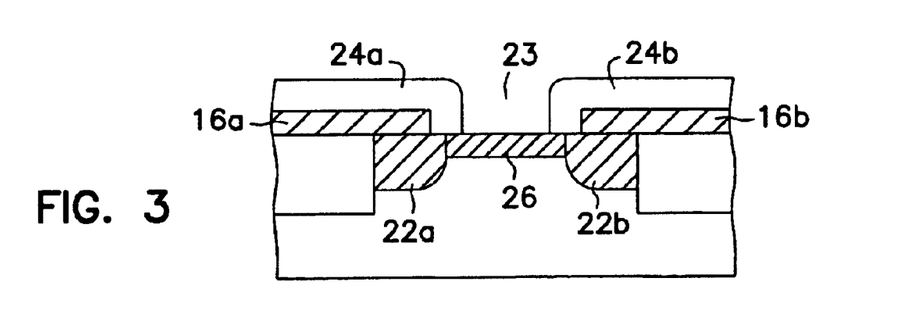
FIG. 3 is a cross-sectional view of the FIG. 2 assembly after forming extrinsic base regions 22a–22b, hole 23, insulative sidewalls 24a and 24b, and intrinsic base region 26.
Figure 4:
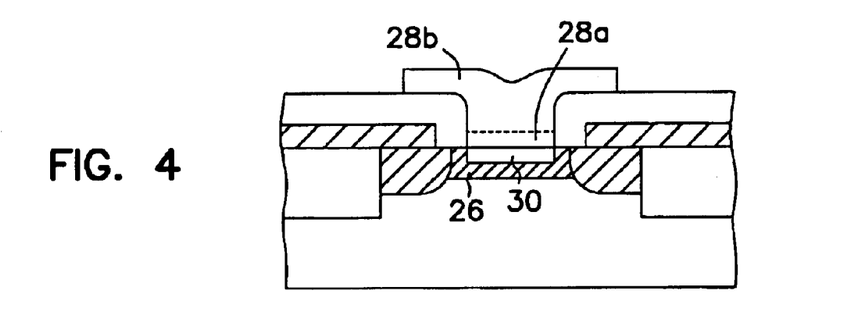
FIG. 4 is a cross-sectional view of the FIG. 3 assembly after forming a two-layer polysilicon structure comprising layers 28a and 28b.
Figure 5:
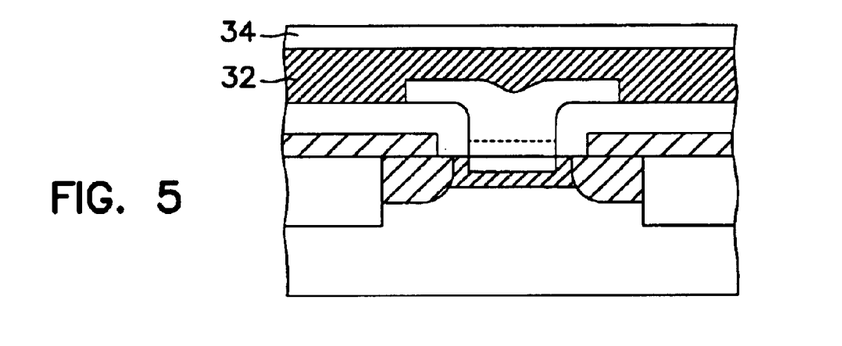
FIG. 5 is a cross-sectional view of the FIG. 4 assembly after forming layers 32 and 34 on polysilicon structure 28.
Figure 6:
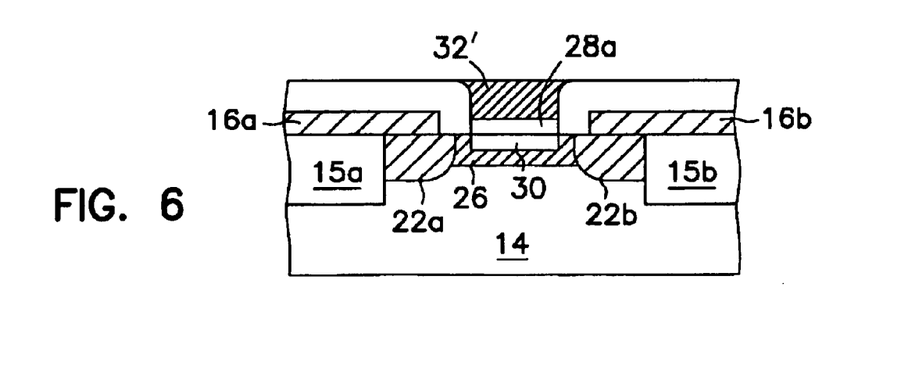
FIG. 6 is a cross-sectional view of the FIG. 5 assembly after substituting metal from layer 32 with polysilicon structure 28 to produce a metal emitter contact 32'.

1–3 depict part of a conventional method of making a standard double-polysilicon, self-aligned ipolar transistor, and FIGS. 4–6 illustrate an extension to the process that ultimately yields an exemplary structure for a bipolar transistor which has a metal emitter contact, and therefore provides a lower emitter resistance and higher current gain than conventional bipolar transistors which have polysilicon emitter contacts.

Figure 1:
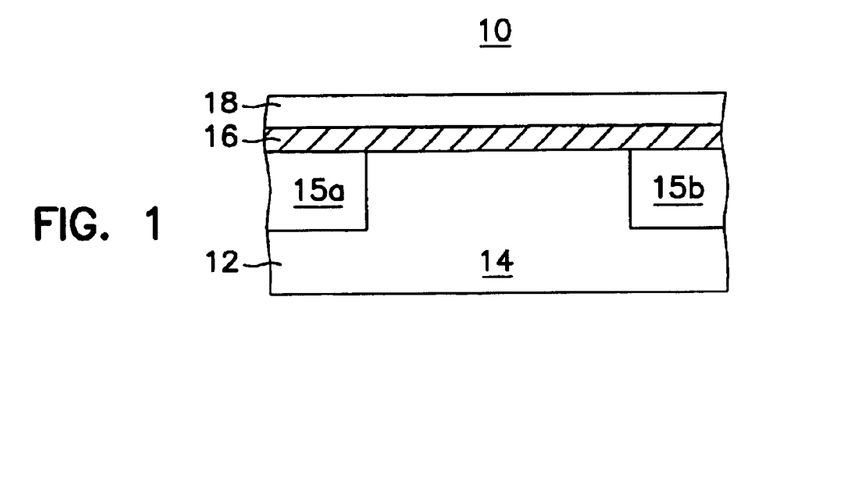
FIG. 1 is a cross-sectional view of an integrated-circuit assembly in fabrication.

More specifically, as shown in FIG. 1, the conventional process begins with an n-type silicon substrate 12. The term "substrate," as used herein, encompasses a semiconductor wafer as well as structures having one or more insulative, semi-insulative, conductive, or semiconductive layers and materials. Thus, for example, the term embraces silicon-on-insulator, silicon-on-sapphire, and other advanced structures.

The method then forms a buried collector 14 and local oxidation regions 15a and 15b in substrate 12. Local oxidation preferably follows a LOCOS isolation process. Afterward, the method grows or deposits a heavily p-type doped (P+) polysilicon layer 16 on the substrate. Polysilicon layer 16 may be doped during the deposition (in situ) or through an implantation procedure after deposition. An insulative layer 18, such as silicon dioxide, is then deposited or grown on polysilicon layer 16.

Figure 2:
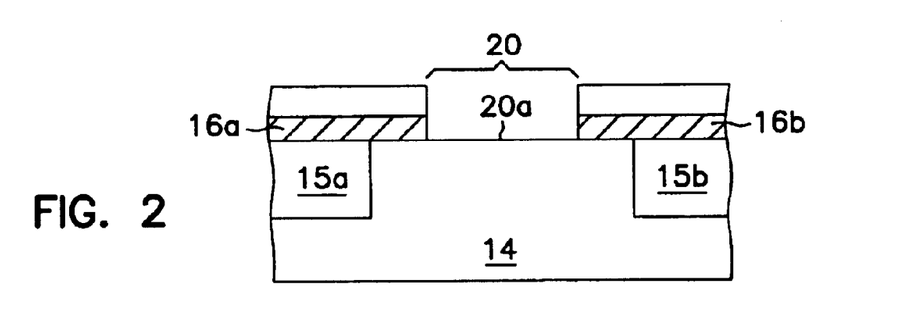
FIG. 2 is a cross-sectional view of the FIG. 1 integrated-circuit assembly after opening a window 20 in layers 16 and 18.

In FIG. 2, the method opens a window 20 through insulative layer 18 and polysilicon layer 16, exposing a portion of underlying substrate 12 and thus defining an active region 20a of substrate 12. This procedure, which entails etching through layers 16 and 18 down to substrate 12, effectively divides polysilicon layer 16 into left and right segments 16a and 16b that will serve as base contacts. As known in the art, the position of window 20 is important to the self-alignment of the base and emitter contacts. If the overlap of segments 16a and 16b with the active region 20a is too large, the resulting bipolar transistor will suffer from an overly large base-collector capacitance and a consequent reduction of switching speed. On the other hand, if the overlap is too small, the resulting transistor will be fatally flawed, since inevitable lateral encroachment of oxide regions 15a and 15b will eliminate the base contact with region 20a and thwart transistor operation.

In FIG. 3, the method outdiffuses extrinsic base 22a and 22b from polysilicon segments 16a and 16b. As known in the art, this is a high temperature procedure generally requiring temperatures in the range of 900–1000° C. After this, an insulative layer 24 is grown or deposited on segments 16a–16b and active region 20a, and subsequently etched back to substrate 12, leaving oxide sidewall spacers 24a and 24b and a hole 23. The method then implants, through hole 23, an intrinsic p-type base region 26 between extrinsic bases 22a and 22b.

The conventional method would next entail forming a heavily n-type doped (n+) polysilicon emitter contact within hole 23 and then out-diffusing some of the n+ dopant into base region 26 to form an n+ emitter region. However, in contrast to this conventional approach which yields a polysilicon emitter contact having higher-than-desirable emitter contact resistance, the exemplary method, as FIG. 4 shows, forms a two-layer polysilicon structure 28 in hole 23, comprising a metal-diffusion-barrier layer 28a on base region 26 and a doped polysilicon layer 28b on barrier layer 28a. After forming n+ emitter region 30 in base region 26 through out-diffusion as would the conventional process, the method substitutes metal for at least a portion of polysilicon layer 28b to form a low-resistance emitter contact 32'.

More specifically, after forming hole 23 and sidewall spacers 24a and 24b, the exemplary method forms diffusion barrier layer 28a in hole 23 on emitter region 28. Layer 28a is preferably 200–300 Angstroms thick and comprises heavily n-type doped (n+) polysilicon carbide (SiC), with 50 percent carbon. In other embodiments, diffusion barrier layer 28a consists of microcrystalline silicon carbide, polycrystalline silicon oxycarbide, titanium nitride, amorphous silicon, or other suitable metal-diffusion-barring material.

After formation of diffusion layer 28a, the method forms polysilicon layer 28b with a silane precursor to a desired thickness of 500 nanometers. In the exemplary embodiment, layers 28a and 28b are formed in a continuous polysilicon deposition procedure, initially depositing polysilicon with a carbon additive to form layer 28a and subsequently discontinuing the additive to form layer 28b. For further details on the formation of the exemplary diffusion barrier, refer to H. Moller, et al., "In-situ P- and N- Doping of Low-Temperature Grown Beta-SiC Epitaxial Layers on Silicon," (Proceedings of International Conference on Silicon Carbide and Related Materials, pp. 497–500, 1996. IOP Publishing, United Kingdom) which is incorporated herein by reference. In addition, see Z. A. Shafi et al., "Poly-crystalline Silicon-Carbide (SiCarb) Emitter Bipolar Transistors," IEEE Bipolar Circuits and Technology Meeting, Minneapolis, Minn. pp. 67–70, 1991, which is also incorporated herein by reference.

Next, the method substitutes metal, preferably an aluminum alloy, for polysilicon layer 28b to form metal emitter contact 32'. FIG. 5 shows that, in the exemplary embodiment, this entails forming a one-half-micron-thick metal layer 32, consisting of an aluminum alloy having 0.3–4.0 percent copper and 0.3–1.6 percent silicon, over polysilicon layer 28b by a deposition technique such as evaporation or sputtering. The method then entails formation of a 0.1–0.2 micron-thick, titanium layer 34 on metal layer 32, again preferably using a deposition technique. In other embodiments, layer 34 is between 20 and 250 nanometers thick and comprises zirconium or hafnium, instead of titanium. Layer 34, which is optional, reduces the temperature and time necessary to complete the next step, which forces a metal-substitution reaction between metal layer 32 and polysilicon layer 28b.

To force this reaction between aluminum and polysilicon, the exemplary method heats, or anneals, the integrated-circuit assembly to 450° C. in a nitrogen, forming gas, or other non-oxidizing atmosphere for approximately 60 minutes. Heating urges diffusion of metal layer 32 into polysilicon layer 28b and vice versa. ultimately substituting polysilicon layer 28b with metal from metal layer 32, an aluminum alloy in the exemplary embodiment. This substitution process is bounded at the interface of polysilicon layer 28b and metal-diffusion barrier 28a. The annealing process yields a superficial by-product of polysilicon and titanium silicide. Removing the by-product by chemical mechanical polishing or other suitable planarization techniques leaves a metal emitter contact 32', as shown in FIG. 6.

Other embodiments of the bipolar transistor and fabrication method form emitter contact 32' from metals other than the exemplary aluminum alloy. For example, other embodiments form the emitter contact from more conductive, but costlier metals, such as gold and silver. In these embodiments, layer 28b comprises a polycrystalline silicon-germanium alloy with 10 to 60 percent germanium.

These embodiments require different annealing temperatures to effect the metal substitution reaction. In general, the annealing, or substitution, temperature should not exceed the eutectic temperature of the metallic system comprising metal layer 32 and layer 28b. To form a gold gate contact one would form layer 32 from gold and anneal at approximately 300° C., and to form a silver gate contact one would form layer 32 from silver and anneal at approximately 500–600° C. These embodiments also use zirconium, which has a lower solubility than titanium and hafnium in silver and gold, to form optional layer 34.

Changing the composition of layer 28b will also affect the annealing temperature. For example, layer 28b may comprise polysilicon and germanium, not just polysilicon. In the aluminum embodiment, this change reduces the anneal temperature to approximately 400° C., instead of 450° C.

In addition, other embodiments omit barrier layer 28a. In contrast to the exemplary embodiment where this layer not only prevents diffusion of emitter metal into base and emitter regions 26 and 30, but also facilitates control of the metal-substitution process, embodiments lacking barrier layer 28a are somewhat less reliable and more difficult to make.

Furthermore, the methods described above to fabricate a bipolar transistor with a metal emitter contact are useful to form silicon-germanium (SiGe) heterojunction bipolar transistors suitable for RF wireless applications. In RF applications, reducing emitter resistance to avoid emitter degeneration and its attendant current-gain reductions is generally more important than in other applications, such as digital memory and logic circuits. These SiGe heterojunction transistors are similar in structure and composition to assembly 10, except that base region 26 consists of a uniform or graded silicon-germanium $Si_{1-x}Ge_x$ composition, where x is a variable. For the graded base composition, x varies with depth, preferably increasing with distance from emitter 30.

Figure 7:
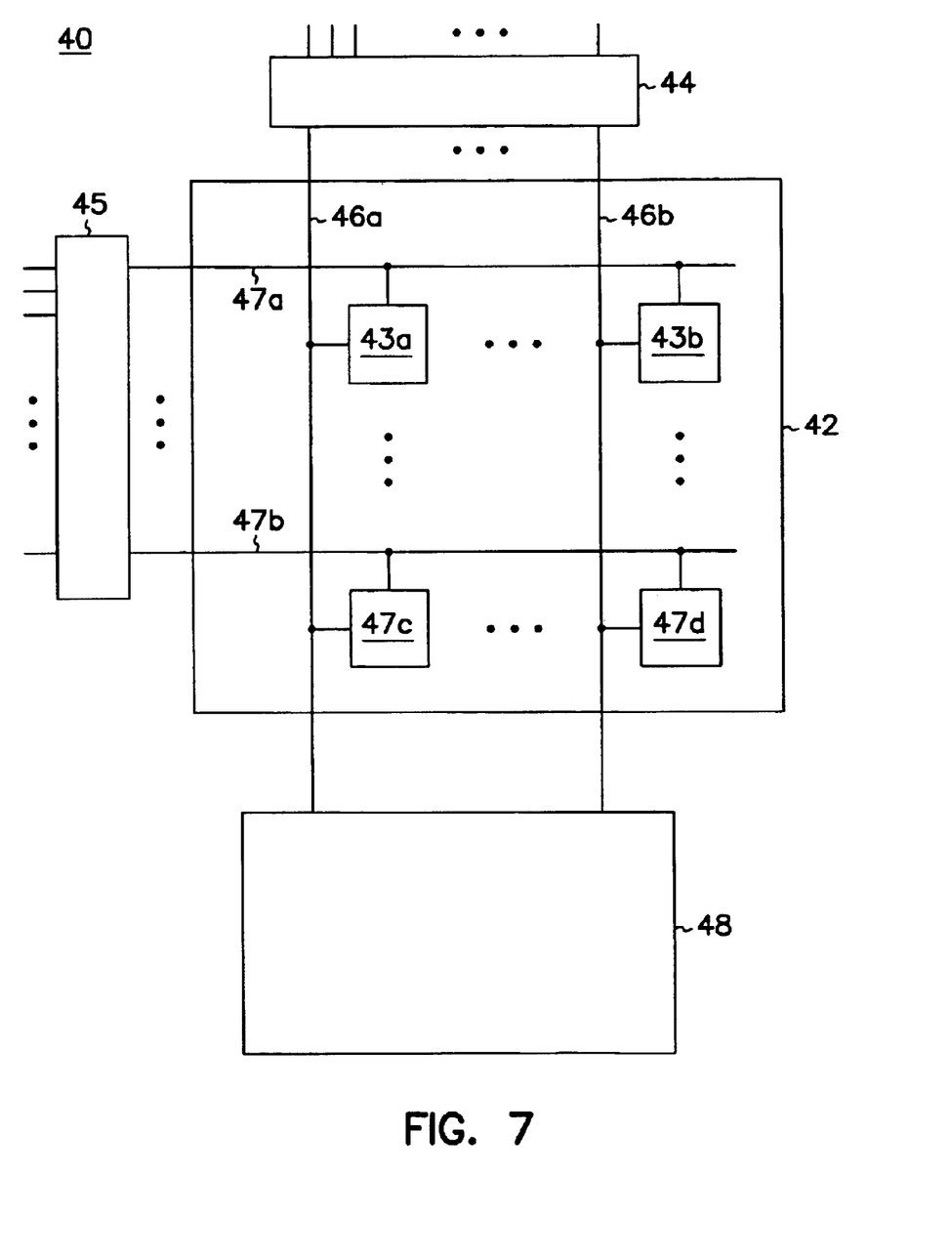
FIG. 7 is a block diagram of a generic dynamic-random-access-memory circuit that incorporates bipolar transistors having low-resistance emitter contacts according to the present invention.

Exemplary Embodiment of an Integrated Memory Circuit Incorporating the Bipolar Transistor with Low-Resistance Emitter Contact FIG. 7 shows one example of the unlimited number of applications for transistors having the low-resistance emitter structure of the present invention: a generic integrated memory circuit 40. Memory circuit 40 includes a number of subcircuits, which comprise one or more bipolar transistors. More precisely, circuit 40 includes a memory array 42 which comprises a number of memory cells 43, a column address decoder 44, and a row address decoder 45, bit lines 46, word lines 47, and voltage-sense-amplifier circuit 48 coupled in conventional fashion to bit lines 46.

In the exemplary embodiment, each of the memory cells, the address decoders, and the amplifier circuit includes one or more bipolar transistors that has the low-resistance emitter structure of the present invention. However, in other embodiments, only one of the components, for example, memory array 42 or voltage-sense-amplifier circuit 48, includes bipolar transistors with the low-resistance emitter structure. Circuit 40 operates according to well-known and understood principles.

CONCLUSION

The present invention provide practical structures, fabrication methods, and circuits for bipolar transistors with low-resistance emitter contacts of aluminum, silver, gold, or other metals. One method embodiment forms a polysilicon emitter contact self-aligned with polysilicon base contacts and then replaces or substitutes at least a portion of the polysilicon emitter contact with aluminum, not only forming a low-resistance aluminum contact, but also precluding exposure of the aluminum contact to the aluminum-melting temperatures occurring during emitter and base formation.

The embodiments described above are intended only to illustrate and teach one or more ways of practicing or implementing the present invention, not to restrict its breadth or scope. The actual scope of the invention, which embraces all ways of practicing or implementing the invention, is defined only by the following claims and their equivalents.

What is claimed is:

1. A method of making an emitter contact for an emitter region of a bipolar transistor, the method comprising:
    forming a polysilicon structure over an emitter region position of a semiconductive substrate, the substrate having a surface at the emitter region position;
    providing a metal; and
    cross-diffusing at least portion of the provided metal and at least a portion of the polysilicon structure to produce a metal emitter contact entirely above the surface of the substrate at the emitter region position.

2. The method of claim 1 further including forming an emitter region at the emitter region position after forming the polysilicon structure.

3. The method of claim 2 wherein the polysilicon structure includes a doped layer and forming the emitter region comprises outdiffusing dopant from the doped layer to the emitter region position.

4. A method of making an emitter contact for an emitter region of a bipolar transistor, the method comprising:
    forming a polysilicon structure over an emitter region position of a semiconductive substrate, the substrate having a surface at the emitter region position, wherein forming the polysilicon structure on an emitter region position comprises:
        forming a diffusion barrier layer; and
        forming a polysilicon layer on the diffusion barrier layer;
    providing a metal in contact with the polysilicon structure; and
    cross-diffusing at least a portion of the provided metal and at least a portion of the polysilicon structure to produce a metal emitter contact entirely above the surface of the substrate at the emitter region position.

5. A method of making an emitter contact for an emitter region of a bipolar transistor, the method comprising:
    forming a polysilicon structure over an emitter region position of a semiconductive substrate, the substrate having a surface at the emitter region position, wherein forming the polysilicon structure on an emitter region position comprises:
        forming a diffusion barrier layer, wherein the diffusion barrier layer comprises at least one of the following: a silicon carbide, a silicon oxycarbide, and a titanium nitride; and forming a polysilicon layer on the diffusion barrier layer;
        providing a metal in contact with the polysilicon structure;
        cross-diffusing at least a portion of the provided metal and at least a portion of the polysilicon structure to produce a metal emitter contact entirely above the surface of the substrate at the emitter region position.

6. The method of claim 4, wherein the polysilicon layer includes polysilicon and germanium.

7. The method of claim 1 wherein cross-diffusing at least a portion of the provided metal and the polysilicon structure comprises cross-diffusing the provided metal and substantially all of the polysilicon structure.

8. The method of claim 1 wherein cross-diffusing at least a portion of the provided metal and the portion of the polysilicon structure comprises:

heating the provided metal and the polysilicon structure.

9. The method of claim 1 wherein the metal comprises at least one of aluminum, gold, and silver.

10. A method of making an emitter contact for a bipolar transistor, the method comprising:
   forming a polysilicon structure on an active region of the transistor, the polysilicon structure including:
      a diffusion barrier layer on the active region; and
      a polysilicon layer on the diffusion barrier layer;
   providing a metal; and
   cross-diffusing at least a portion of the provided metal and at least a portion of the polysilicon layer to thereby form an emitter contact.

11. The method of claim 10, wherein the polysilicon layer includes a dopant.

12. The method of claim 10, wherein the diffusion barrier layer comprises at least one of the following: a silicon carbide, a silicon oxycarbide, and a titanium nitride, and the polysilicon layer includes polysilicon and germanium.

13. The method of claim 10 wherein cross-diffusing metal and the polysilicon layer comprises cross-diffusing metal and substantially all of the polysilicon layer.

14. The method of claim 10 wherein cross-diffusing metal and at least a portion of the second polysilicon layer, comprises:
   depositing metal on the polysilicon layer; and
   heating the deposited metal and the polysilicon layer.

15. The method of claim 10 wherein the metal comprises at least one of aluminum, gold, and silver.

16. A method of making an emitter contact for a bipolar transistor, the method comprising:
   forming a polysilicon structure on an emitter region position of the transistor, the polysilicon structure including a doped diffusion barrier layer on the emitter region position and a polysilicon layer on the diffusion barrier layer;
   depositing metal including at least one of aluminum, gold, and silver on the polysilicon layer; and
   heating at least the deposited metal and the polysilicon structure to urge diffusion of the deposited metal into the polysilicon layer, with the doped diffusion barrier layer inhibiting diffusion of the deposited metal into the emitter region position of the transistor.

17. The method of claim 16, wherein the diffusion barrier layer comprises at least one of the following: a silicon carbide, a silicon oxycarbide, and a titanium nitride.

18. A method of making a metal contact for a bipolar transistor, the method comprising:
   forming a conductive diffusion barrier over an emitter region position of the transistor;
   forming a polysilicon structure on the conductive diffusion barrier;
   forming a metal layer on the polysilicon structure; and
   cross-diffusing at least a portion of the metal layer and at least a portion of the polysilicon structure to form a metal contact having a lower-most surface overlying the emitter region position of the transistor.

19. The method of claim 18 further including forming an emitter region in the layer underneath and in contact with the polysilicon structure.

20. The method of claim 19 wherein the polysilicon structure includes a doped layer contacting a region of the layer and forming the emitter region comprises diffusing dopant from the doped layer into the region.

21. A method of making a bipolar transistor having self-aligned base contacts and self-aligned metal emitter contact, the method comprising:
   forming first and second polysilicon base contacts on a semiconductive layer, the contacts spaced apart to define an active region in the semiconductive layer;
   outdiffusing dopant from the first and second base contacts into the semiconductive layer to form extrinsic base regions aligned with the base contacts;
   implanting an intrinsic base region in the active region;
   forming a doped diffusion barrier layer on the intrinsic base region;
   forming a doped polysilicon layer on the doped diffusion barrier layer;
   forming an emitter region self-aligned with the doped diffusion barrier layer by outdiffusing dopant from the doped diffusion barrier layer into the intrinsic base region;
   forming a metal layer in contact with the doped polysilicon layer; and
   cross-diffusing at least a portion of the metal layer and at least a portion of the polysilicon layer after forming the emitter region, thereby forming a metal emitter contact self-aligned with the emitter region.

22. The method of claim 21:
   wherein cross-diffusing at least a portion of the metal layer and at least a portion of the polysilicon structure includes cross-diffusing metal and substantially all of the polysilicon layer.

23. The method of claim 22, wherein the diffusion barrier layer comprises at least one of the following: a silicon carbide, a silicon oxycarbide, and a titanium nitride, and the polysilicon layer includes polysilicon and germanium.

24. The method of claim 22 wherein cross-diffusing metal and substantially all of the polysilicon layer comprises:
   depositing metal on the polysilicon layer; and
   heating at least the deposited metal and the polysilicon layer to a predetermined temperature.

25. The method of claim 21 wherein the metal comprises at least one of aluminum, gold, and silver.

26. A method of reducing emitter resistance of a bipolar transistor, the method comprising:
   forming a bipolar transistor structure having a polysilicon emitter contact electrically coupled to an emitter region of the transistor structure, with the polysilicon emitter having an electrical resistance;
   forming a metal layer in contact with the polysilicon emitter; and
   cross-diffusing at least a portion of the metal layer and at least a portion of the polysilicon emitter contact to reduce the electrical resistance of the contact.

27. A method of making a bipolar transistor having self-aligned base contacts and self-aligned metal emitter contact, the method comprising:
   forming first and second polysilicon base contacts on a semiconductive layer, the contacts spaced apart to define an active region in the semiconductive layer;
   outdiffusing dopant from the first and second base contacts into the semiconductive layer to form extrinsic base regions aligned with the base contacts;
   implanting an intrinsic base region in the active region;
   forming a doped polysilicon structure on the intrinsic base region, wherein the polysilicon structure includes:
      a doped diffusion barrier layer on the intrinsic base region; and
      a polysilicon layer on the doped diffusion barrier layer; and
   forming an emitter region self-aligned with the doped polysilicon structure by outdiffusing dopant from the doped polysilicon structure into the intrinsic base region;

forming a metal layer in contact with the emitter region; and cross-diffusing at least a portion of the metal layer and substantially all of the polysilicon layer after forming the emitter region, thereby forming a metal emitter contact self-aligned with the emitter region.

28. A method of making a metal emitter contact for an emitter region position of a bipolar transistor, the method comprising:

forming a diffusion barrier layer over the emitter region position of a semiconductive substrate;

forming a polysilicon layer on the diffusion barrier layer and over the emitter region position;

forming a metal layer in contact with the polysilicon layer; and cross-diffusing at least a portion of the metal layer and at least a portion of the polysilicon layer to produce the metal emitter contact, the metal emitter contact electrically coupled to the emitter region through the diffusion barrier layer.

29. A method of making a metal emitter contact for an emitter region position of a bipolar transistor, the method comprising:

forming a diffusion barrier layer over the emitter region position of a semiconductive substrate, wherein the diffusion barrier layer includes a dopant;

forming a polysilicon layer on the diffusion barrier layer and over the emitter region position;

forming a metal layer in contact with the polysilicon layer; and cross-diffusing at least a portion of the metal layer and at least a portion of the polysilicon layer to produce the metal emitter contact, the metal emitter contact electrically coupled to the emitter region through the diffusion barrier layer; and outdiffusing at least a portion of the dopant into the emitter region position.

30. A method of making an emitter contact for an emitter region position of a bipolar transistor, the method comprising:

forming a polysilicon structure over an emitter region position of a semiconductive substrate, the substrate having a surface at the emitter region position;

forming a metal layer over the polysilicon structure; and cross-diffusing at least a portion of the metal layer and at least a portion of the polysilicon structure to produce a metal emitter contact have a surface confronting the surface of the substrate.

31. The method of claim 30 further including forming an emitter region at the emitter region position after forming the polysilicon structure.

32. The method of claim 30 further including forming an emitter region at the emitter region position after forming the polysilicon structure and before substituting metal.

33. The method of claim 30 wherein the polysilicon structure includes a doped layer and forming the emitter region comprises outdiffusing dopant from the doped layer to the emitter region position.

34. The method of claim 1, wherein cross-diffusing at least a portion of the provided metal with at least a portion of the polysilicon structure comprises diffusing metal from a metal layer that contacts the polysilicon structure into the polysilicon structure and diffusing polysilicon into the metal layer.

35. The method of claim 1, wherein cross-diffusing at least a portion of the provided metal with at least a portion of the polysilicon structure displaces polysilicon in the portion of the polysilicon structure.

* * * * *